INVENTORS
Charles J. Swartwout
Allen E. Lepley
Donald S. Oliver

BY Mueller & Aichele

ATTY'S.

INVENTORS
Charles J Swartwout
Allen E. Lepley
Donald S. Oliver
BY
Mueller & Aichele
ATTY'S Nov. 1, 1966 C. J. SWARTWOUT ET AL 3,283,239

PRECISION SOLID STATE RATIO BRIDGE

Filed Oct. 14, 1963

3 Sheets-Sheet 3

INVENTORS
Charles J. Swartwout
Allen E. Lepley
Donald S. Oliver

BY

Mueller & Aichele

ATTY'S.

United States Patent Office 3,283,239
Patented Nov. 1, 1966

3,283,239

PRECISION SOLID STATE RATIO BRIDGE

Charles J. Swartwout, Allen E. Lepley, and Donald S. Oliver, Scottsdale, Ariz., assignors to Motorola, Inc., Chicago, Ill., a corporation of Illinois Filed Oct. 14, 1963, Ser. No. 316,012
2 Claims. (Cl. 323—75)

The present invention relates to bridge networks, and it relates more particularly to an improved solid state ratio bridge.

The improved solid state ratio bridge network of the embodiment of the invention to be described utilizes variable capacitor diodes generally known to the art as varactors.

The varactor is a voltage-variable semiconductor diode capacitor which is constructed to permit its capacitance conveniently to be controlled by applied voltage. Such diodes are often simply called variable-capacitance diodes. The variable capacitance of the diode occurs because increasing the voltage drop across any semiconductor barrier causes a widening of the charge-depletion region of the barrier. Such voltage-variable capacitors are described, for example, in an article by S. L. Miller at page 1248 of the Physical Review (vol. 105, No. 4, Feb. 15, 1957).

The use of such varactors in a measurement bridge permits the resulting network to incorporate a re-balancing system based on the characteristics of these solid state devices, so that there is no need to use mechanical linkages for re-balancing purposes. This results in increased stability and reliability as compared with the usual prior art mechanical re-balancing measurement bridge networks.

For all except very low reverse voltages, the capacitance of a semiconductor device is due largely to the depletion of carriers at or near the barrier. The bias voltage draws mobile charge carriers away from the barrier leaving the stationary charge due to the donors and acceptors in a depletion layer which includes the barrier. The width of this depletion layer is a function of the applied voltage, and it acts as a variable capacitance with a parasitic series resistance. The depletion layer does not have a precisely defined edge, so at low reverse voltages the contribution of diffusion capacitance and other mechanisms must be considered in order to give an acceptable theory of junction capacitance. For purposes of this application, the explanation based on depletion-layer capacitance, however, will suffice.

A particular embodiment of the bridge network to be described includes a transformer with a movable core. The center tapped secondary of the transformer serves as one portion of the bridge, and one or more varactors serves as the second portion. Then, movement of the core of the transformer causes the ratio of voltages across the two halves of the secondary to change so that the bridge becomes unbalanced; the balanced condition of the bridge can be restored by a corresponding variation in a direct current bias applied to the varactor. Conversely, the bridge can be unbalanced by variation in the direct current bias, and restored to the balanced condition by movement of the core. When two varactors are used to constitute the second portion of the bridge, and when the bias control on the varactors is such that their capacitance varies in opposite directions for changes in bias, increased linearity can be realized, as will be described.

The relationship between the above-mentioned direct current bias and the travel of the movable core of the transformer has been found to be substantially linear over small ranges and to be very stable at a particular temperature. However, stability of the bridge is affected at other temperatures because the characteristics of the varactors tend to change with temperature.

For that reason this invention further provides a solid state bridge network which includes temperature compensating means to enable the bridge to be accurate over a wide range of temperatures.

It is, accordingly, an object of the present invention to provide an improved measuremnt ratio bridge network of the solid state type.

Another object of the invention is to provide such an improved bridge network which utilizes solid state elements of the voltage-variable capacitance type so as to obviate any need for mechanical re-balancing linkages, and the like.

Yet another object of the invention is to provide such an improved solid state measurement ratio bridge network which is mechanically rugged and which exhibits a high degree of reliability and stability, as compared with the usual prior art measurement bridges.

A still further object of the invention is to provide such an improved and accurate bridge network, whose accuracy is maintained over a wide range of temperatures.

Other objects and advantages of the invention will become apparent from a consideration of the following specification, when the specification is taken in conjunction with the accompanying drawings, in which.

Figure 1:
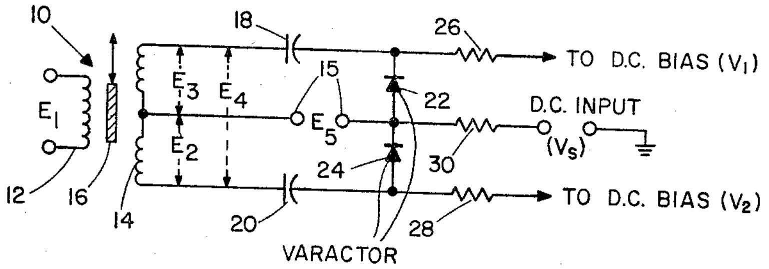
FIGURE 1 is a schematic representation of a solid state ratio bridge network constructed in accordance with one embodiment of the invention.

The improved bridge network of FIGURE 1 includes a variable transformer 10 which includes a primary winding 12 and a secondary winding 14. The core 16 of the variable transformer 10 is movable, so as to control the coupling between the primary winding 12 and the secondary winding 14. The center tap of the secondary winding 14 is connected to an output terminal 15.

A pair of capacitors 18 and 20 are connected to the secondary winding 14, and these capacitors function as direct current blocking capacitors. A pair of variable-capacitance diodes (varactors) 22 and 24 are connected to the capacitors 18 and 20, and in series to one another, as shown. The other output terminal 15 is connected to the common junction of the varactors 22 and 24.

A direct current bias is applied from respective sources $V_1$ and $V_2$ to the varactors 22 and 24 through respective resistors 26 and 28, these resistors serving as alternating current isolation resistors. The direct current control for the bridge of FIGURE 1 is applied to the common junction of the varactors 22 and 24 through an alternating current isolation resistor 30.

When the transformer 10 is excited by an alternating current signal $E_1$ applied to the primary winding 12, a pair of alternating current signals $E_2$ and $E_3$ are developed across the respective halves of the secondary winding 14, on either side of the center tap. If the movable core 16 is symmetrically disposed with respect to the two halves of the secondary, the amplitude of the signal $E_2$ will equal the amplitude of the signal $E_3$. However, if the core is moved away from the neutral position, there will be an unbalance between the amplitudes of the signals $E_2$ and $E_3$.

For limited travel of the core 16, the ratio of the amplitudes of the signals $E_2$ and $E_3$ will be a linear function of core travel. This factor renders the bridge of FIGURE 1 ideally suited for use in conjunction with transducer elements. Such transducer elements cause variations of the core 16, with a resulting linear function variation in the ratio between the amplitudes of the signals $E_2$ and $E_3$. It is to be observed that the ratio between the signals $E_2$ and $E_3$ is unaffected by the amplitude of the signal $E_4$ across the entire secondary winding.

This latter signal $E_4$ equals the sum of the signals $E_2$ and $E_3$. For limited core travels, the signal amplitude $E_4$ is essentially constant, so long as the input signal $E_1$ remains constant. The signal $E_4$ is the excitation on the other two legs of the bridge of FIGURE 1, which comprise the varactors 22 and 24.

The varactors 22 and 24 are semiconductor diodes whose capacitance varies as a function of the applied direct current voltage, in accordance with the formula:

$$C=\frac{k}{(V_o+V)^n} \qquad (1)$$

where:

$k$=proportionality constant
$V_o$=contact potential
$V$=applied direct current potential
$n$=characteristic exponent.

It has been determined both theoretically and experimentally that the relationship expressed by Equation 1 is extremely precise and stable. Introduction of a direct current input voltage ($V_S$) through the resistor 30 to the junction of the varactors 22 and 24 results in a change in relative capacitances of the varactors as a function of the direct current input voltage.

An increase in the direct current input voltage ($V_S$) causes one of the varactors 22 or 24 to increase its value and the other to decrease its value, thus causing a change in the capacitance ratio of the two varactors. The direct current input voltage ($V_S$) can be controlled so that the alternating curent bridge output signal ($E_5$) appearing across the output terminals 15 can be brought back to a null for any position of the movable core.

It will be appreciated, therefore, thate the varactors 22 and 24 are connected into the bridge circuit of FIGURE 1 in such a manner that changes in direct current bias produce opposite capacitance changes in the varactors. These opposite capacitance changes are used to establish a balancing ratio of voltages across the bridge to compensate in the aforementioned change in ratio $E_2/E_3$.

Figure 2A:
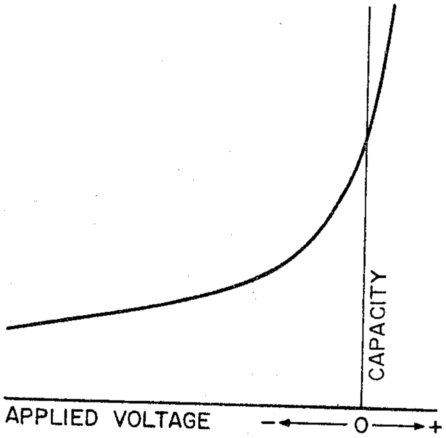
FIGURES 2A and 2B are curves useful in explaining the characteristics of the circuit of FIGURE 1.
Figure 2B:
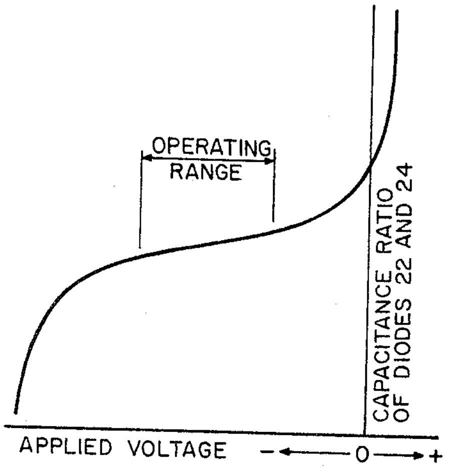

It is clear that a single varactor could be used in the bridge network, in conjunction with a capacitance element that does not exhibit voltage-variable characteristics. However, the capacity versus applied voltage characteristic of the varactor (Equation 1), and as shown in the curve of FIGURE 2A, is not linear. When two varactors are used each complements the other, so that greater sensitivity and a wider essentially linear range is achieved, as illustrated in the curve of FIGURE 2B.

As mentioned above, the relationship between $V_1$ and the travel of the core 16 is approximately linear over small ranges, and is extremely stable at a particular temperature. The network of FIGURE 3 incorporates additional circuitry for enabling the bridge to be accurate over a wide range of temperatures.

Figure 3:
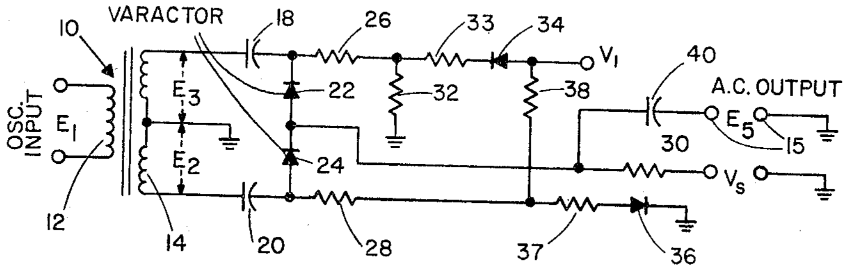
FIGURE 3 is a schematic representation of a modification of the bridge network incorporating temperature compensating network means.

In the circuit of FIGURE 3, elements similar to those described in conjunction with FIGURE 1 have been identified with the same numerals. In the representation of FIGURE 3, the center tap of the secondary winding 14 is connected to a point of reference potential, such as ground. The latter circuit also includes a grounded resistor 32 which is connected to the junction of the resistor 26 and a resistor 33, the resistor 33 being connected to the cathode of a diode 34. The diode 34 is used for temperature compensation purposes, and it can be a silicon diode, a varactor or any other suitable type. The resistor 33, likewise, serves a temperature compensation function in that it tends to counteract variations in bias due to resistance changes in the circuit supplying the bias ($V_1$) with variations in temperature.

Likewise, a similar temperature compensating diode 36 is included in circuit with the isolating resistor 28 and the capacitor 20, the anode of the diode 36 being connected to a temperature compensating resistor 37. The anode of the diode 34 and the cathode of the diode 36 are respectively connected to direct current bias sources $V_1$ and ground. A resistor 38 is connected from the anode of the diode 34 to the anode of the diode 36. The resistors 33 and 37 also serve to match the changes in the characteristics of the temperature compensating diodes 34 and 36 closely with the individual varactors 22 and 24.

The alternating current output of the bridge of FIGURE 3 is derived across the output terminals 15 from between the common junction of the varactors 22 and 24 and the point of reference potential. A direct current blocking capacitor 40 is interposed between the alternating current output terminals 15 and the junction of the varactors 22 and 24. The direct current input voltage is applied through the resistor 30 to the common junction of the varactors 22 and 24.

As indicated above, the basic varactor equations are:

$$C_{22}=\frac{k_1}{(V_1-V_S-V_o)^n} \qquad (2)$$

$$C_{24}=\frac{k_2}{(V_S-V_2+V_o)^n} \qquad (3)$$

where:

$C_{22}$ and $C_{24}$ are the respective capacitances of the varactors 22 and 24
$k_1$ and $k_2$ are varactor capacitance coefficients.

The contact potential ($V_0$) varies with the temperature according to the relationship $$V_0=V_0^1-\alpha\Delta T \qquad (4)$$

where:

$V_0$ is the contact potential at any temperature
$V_0^1$ is the contact potential at 20° C.
$\Delta T$ is the change in temperature from 20° C., in 0° C.
$\alpha$ is the temperature coefficient in mv./degrees centigrade.

Therefore, the basic varactor equations must be modified to:

$$C_{22}=\frac{k_1}{(V_1-V_S-V_o^1+\alpha\Delta T)^n} \qquad (5)$$

$$C_{24}=\frac{k_2}{(V_S-V_2+V_o^1-\alpha\Delta T)^n} \qquad (6)$$

By changing the bias voltages $V_1$ and $V_2$ it is possible to eliminate the temperature effects of the contact potential. The contact potential of the silicon diode, for example, varies approximately with temperature according to the relation $$V=-V^1\beta\Delta T \qquad (7)$$

where:

$V^1$ is the contact potential at 20° C.
$V$ is the contact potential at any temperature
$\Delta T$ is the change in temperature from 20° C. in ° C.
$\beta$ is the temperature coefficient in mv./degrees centigrade.

Thus, by appropriately using silicon diodes in conjunction with the bias voltages, the temperature effect of the varactors may be cancelled. Such silicon diodes are illustrated in FIGURE 3 as the diodes 34 and 36. The equations for the temperature compensated bridge of FIGURE 3, then become $$V_{34}=V_{34}{}^1-\beta\Delta T \qquad (8)$$

where:

$V_{34}{}^1$ is the contact potential of the diode 34 at 20° C.
$V_{34}$ is the contact potential at any temperature.

$$V_{36}=V_{36}{}^1-\beta\Delta T \qquad (9)$$

where:

$V_{36}$ is the contact potential of the diode 36 at any temperature
$V_{36}{}^1$ is the contact potential of the diode 36 at 20° C.

$$C_{22}=\frac{k_1}{[V_1-V_S+(V_{34}{}^1-\beta\Delta T)-V_o{}^1-\alpha\Delta T]^n} \qquad (10)$$

$$C_{24}=\frac{k_2}{[V_S-(V_2+V_{36}{}^1-\beta\Delta T)+V_o-\alpha\Delta T]^n} \qquad (11)$$

Therefore, $$C_{22}=\frac{k_1}{[V_1-V_S+V_{34}{}^1-V_o{}^1+\Delta T(\beta-\alpha)]^n} \qquad (12)$$

and $$C_{24}=\frac{k_2}{[V_S-V_2-V_{36}{}^1+V_o{}^1+\Delta T(\beta-\alpha)]^n} \qquad (13)$$

The silicon diodes 34 and 36 are chosen to have characteristics with respect to the varactors 22 and 24 such that $\beta$ is made equal to $\alpha$, then the basic equations reduce to:

$$C_1=\frac{k_1}{(V_1-V_S+V_{34}{}^1-V_o{}^1)^n} \qquad (14)$$

$$C_2=\frac{k_2}{(V_S-V_2-V_{36}{}^1+V_o{}^1)^n} \qquad (15)$$

It is to be noted that the last two equations are independent of temperature. Therefore, by the appropriate choice of the silicon diodes 34 and 36 in series with the bias voltage sources $V_1$ and $V_2$, the basic capacitance equations of the varactors 22 and 24 show that the capacitance of the varactors is effectively rendered independent of temperature.

Figure 4:
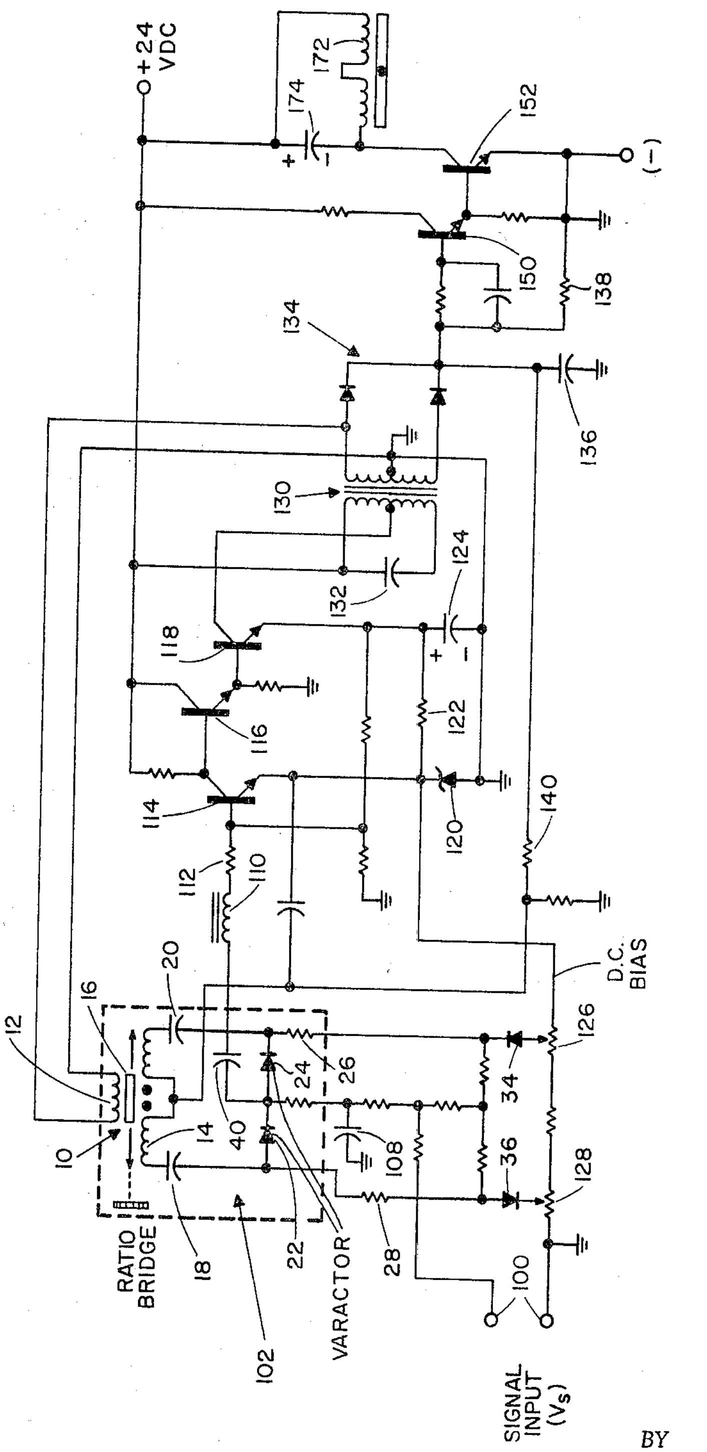
FIGURE 4 is a circuit diagram of an amplifier circuit incorporating the improved temperature compensated bridge of the present invention.

The circuitry of FIGURE 4 illustrates the improved bridge network of the invention incorporated in a servo system for use, in conjunction with an industrial process control system. The particular application of the bridge network in FIGURE 4 is in an amplifier for driving, for example, a recording pen mechanism. In this instance, the basic input signal is the direct current input ($V_S$) applied to the varactors. This input signal varies in amplitude, and the pen mechanism responds to the amplitude variations to provide corresponding indications on an appropriate record. The feedback servo mechanism drives the movable core 16 to establish a balance position. Again, elements which have been identified previously are identified by the same numbers.

The aforementioned balance position established by the servo is accurately related to the input signal and furnishes an accurate indication on a scale or chart. This technique has the advantage in that no feedback slide wires are required, and the stability of the circuit is not a function of amplitude of the excitation voltage. The bridge also serves as a modulator, as will be described, so that the amplification can be on an alternating current, rather than direct current, so that increased stability may be achieved, as described in more detail, for example, in copending application Serial No. 315,997 of Miller et al., filed October 14, 1965.

In the circuit of FIGURE 4, the signal input ($V_S$) is applied to the bridge circuit 102 across the input terminals 100. The alternating current output from the bridge is introduced through an inductance coil 110 and through a limiting resistor 112 to the base electrode of an NPN transistor 114. The transistor 114, and further NPN transistors 116 and 118 are connected as a high gain alternating current amplifier.

The emitter of the transistor 114 is connected to a Zener diode 120. The anode of the Zener diode is connected to a point of reference potential, such as ground. The Zener diode, and an associated resistor 122, and a capacitor 124 in the emitter circuit of the transistor 118, constitute a bias source for the bridge. The appropriate bias potentials are supplied to the temperature compensating diodes 34 and 36 by potentiometers 126 and 128. In the illustrated embodiment, the temperature compensating diodes 34 and 36 are also varactors, chosen to match the characteristics of the varactors 22 and 24, respectively.

The collector of the transistor 118 is connected to a tap on the primary of an output transformer 130. The primary is shunted by a capacitor 132 to form a tuned tank circuit. The capacitor 132 and the primary of the transformer 130 are connected to the positive terminal of the 24-volt direct voltage source. The center tap of the secondary of the transformer is grounded, and the voltage appearing across the upper half of the secondary is applied to the primary 12 of the transformer 10 in the bridge network. The signal so applied to the primary winding 12 constitutes the alternating current excitation for the bridge. Also, this feedback voltage actually causes the alternating current amplifier to function as an oscillator, so that an alternating current signal is generated in the system. The frequency of the oscillator is established by the tank circuit formed by the capacitor 132 and the primary of the transformer 130.

The bridge network serves as an amplitude modulator for the above-mentioned alternating current signal, in accordance with variations in the direct current signal input voltage $V_S$ applied to the terminals 100.

The resulting alternating current signal appearing across the secondary of the transformer 130 is rectified in a full-wave rectifier 134. The rectified output signal appears across the capacitor 136 and shunting resistor 138. This signal is fed back to the bridge through a negative feedback network which includes a series resistor 140 connected to the center tap of the secondary winding 14. This negative feedback serves to stabilize the system.

The rectified direct current signal appearing across the resistor 138 is also applied to the base of an NPN transistor 150. The transistor 150 and a further NPN transistor 152 are connected as a direct current amplifier.

The emitter of the transistor 152 is grounded, and the collector is connected through an actuator winding 172 to the positive terminal of the 24-volt direct voltage source. The actuator winding 172 is shunted by a capacitor 174. This actuator winding serves, for example, to move the position of the indicator 10 in the servo controlled indicator mechanism, so that an appropriate record may be recorded on the recording medium.

As mentioned above, the frequency of the signal in the amplifier/oscillator system is established by the resonant tank circuit formed by the capacitor 132 and the primary of the transformer 130. The output signal from the amplifier/oscillator is rectified in a full-wave rectifier 134, and the resulting direct current signal is amplified by the direct current amplifier formed by the transistors 150 and 152. The resulting direct current signal passes through the winding 172 to actuate the indicator recording pen.

As mentioned above, any variation in the signal input causes the capacity of the varactor diodes 22 and 24 to change in opposite directions to unbalance the bridge, so that an alternating current is established of a particular amplitude and which is amplified in the alternating current amplifier formed by the transistors 114, 116 and 118. The output from the alternating current amplifier is rectified in the full-wave rectifier 134, and the direct current output signal therefrom is amplified in the amplifier formed by the transistors 150 and 152. The resulting current through the actuator coil 172 causes the recorder pen to move to a position such that the movable core 16 of the transformer 10 in the bridge network is moved in a direction to re-balance the bridge to return the current through the system to a null condition.

Figure 5:
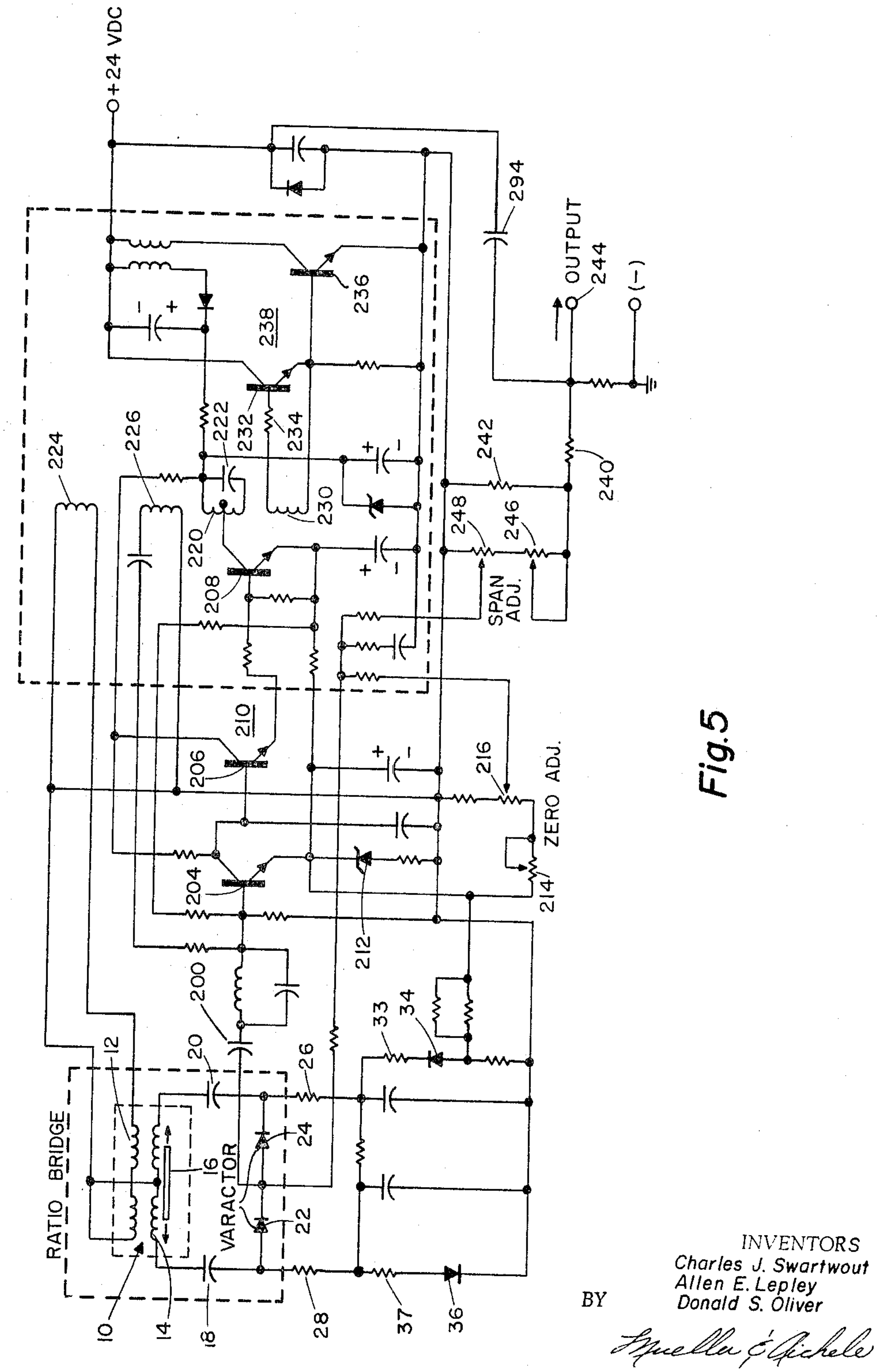
FIGURE 5 is a circuit diagram of another amplifier circuit, likewise incorporating the improved temperature compensated bridge network of the invention.

The amplifier circuit of FIGURE 5, likewise incorporates a ratio bridge network constructed in accordance with the concepts of the present invention. This latter amplifier circuit is similar to the circuit disclosed and claimed in copending application Serial No. 315,997 of Miller et al., filed October 14, 1963.

As described in the copending application, Serial No. 315,997, the amplifier circuit of FIGURE 5 finds utility in the transmitter of an industrial process control system. In the transmitter application, the basic input to the amplifier is the motion of the core or armature of the transformer 10, under the control of a transducer; rather than a variation in the direct current signal input ($V_S$) as was the case in the circuit of FIGURE 4.

In the embodiment of FIGURE 5, the armature 16 of the transformer 10 is moved precisely as a function of input pressure or differential pressure, for example, to unbalance the bridge. The amplifier system responds to the corresponding change in the amplitude of the alternating current signal from the bridge to feed a bias potential to the bridge which causes the direct current input to the varactors 22 and 24 to be automatically varied so as to change their capacity in opposite directions and re-establish a balanced condition in the bridge. This solid state re-balancing of the bridge provides a precise electrical output which is a direct function of the mechanical input. As in the previous embodiment, the use of the bridge of the present invention enables the re-balancing to be carried out without the requirement for any mechanical moving parts.

The common junction of the varactors 22 and 24 is coupled through a capacitor 200 to the base electrode of an NPN transistor 204. This transistor and further NPN transistors 206 and 208 are connected as an alternating current amplifier 210.

A Zener diode 212 and associated circuitry are connected in the emitter circuit of the transistor 204 to supply the bias voltage to the bridge network. The varactors 34 and 36 form the temperature compensating function, as described above.

A potentiometer 214 and a potentiometer 216 form a fine zero adjustment and a coarse zero adjustment, respectively, for the system. The direct current bias voltage developed across these elements is introduced to the varactor 34 as a bias voltage summed with the aforementioned control bias.

The collector of the transistor 208 is connected to a point on an inductive winding 220. The inductive winding 220 is shunted by a capacitor 222 to constitute a tuned tank network. The frequency of the oscillating signal passed by the amplifier 210 is determined by the resonant tank network 220, 222. The winding 220 is inductively coupled to a winding 224.

The winding 224 is connected back to the primary winding 12 of the transformer 10, to constitute the alternating current excitation for the bridge network. This circuit also provides a regenerative feedback for the system, so that oscillation may be sustained therein.

A further winding 226 is coupled to the winding 224, and the winding 226 is connected back to the base of the transistor 204. This latter winding provides degenerative feedback for the system for stabilizing reasons.

The inductive winding 220 is also inductively coupled to a winding 230. The winding 230 is connected to the emitter of an NPN transistor 232, and through a resistor 234 to the base of the transistor. The emitter of the transistor 232 is also connected to the base of a transistor 236. The transistors 232 and 236 form a direct current amplifier 238.

The collector of the transistor 236 is coupled to a voltage boost circuit. This circuit permits the direct current excitation of the system to be increased above the 24-volt level of the direct current source. The voltage boost circuit is discussed in greater detail in copending application Serial No. 316,033 of Oliver, filed October 14, 1963.

A resistor 240, and a feedback resistor 242 are connected between an output terminal 244, and the output of the direct current amplifier 238. A fine span adjustment potentiometer 246, and a coarse span adjustment potentiometer 248 are connected across the resistor 242. The arm of the potentiometer 248 supplies the direct current control voltage to the common junction of the varactors 22 and 24.

Therefore, any variation in the position of the movable core 16 of the transformer 10 changes the ratio of voltages appearing across the two sides of the secondary 14. This produces an unbalanced condition in the bridge, so that the feedback network to the primary 12 of the transformer causes an alternating current error signal of predetermined frequency and of an amplitude indicative of the extent of the unbalanced condition, to be applied to the transistor 204. The alternating current amplifier 210, of which the transistor 204 is a part, is a high gain amplifier, and it serves to amplify this alternating current error signal.

The amplified error signal is applied to the direct current amplifier 238, and a current is drawn by the direct current amplifier through the resistor 242 in response to the error signal. This latter current is a direct current, and its amplitude is related to the amplitude of the error signal.

The direct current drawn by the direct current amplifier through the aforementioned resistor 242, causes a predetermined voltage drop to appear across the resistor. A portion of this voltage drop is selected by the movable arm of the span adjustment potentiometer 248, and is applied to the bridge, as a re-balancing current potential. This potential tends to re-balance the bridge, and the stable state of the system results in a current through the direct current amplifier 238 which bears a direct relationship to the shift of the movable core 16 in the transformer 10 of the bridge network. This current produces a corresponding direct current voltage at the output terminal 244 which is a precise measurement of the shift of the core 16.

The invention provides, therefore, an improved bridge network of the solid state type. This improved network utilizes voltage-variable capacitive elements to control a voltage ratio in the bridge, so that the bridge can be controlled in a precise, accurate and linear manner. This improved network finds particular utility in systems in which precise measurements are required.

While particular embodiments of the invention have been shown and described, modifications may be made, and it is intended in the claims to cover all modifications which fall within the scope of the invention.

What is claimed is:

1. A bridge network including in combination: a first network forming first and second arms for said bridge, a second network coupled to said first network and including inter-connected first and second voltage-variable diode capacitors respectively forming third and fourth arms of the bridge, said voltage-variable diode capacitors exhibiting capacitance changes for changes in ambient temperature, a bias circuit connected to said first and second voltage-variable diode capacitors for establishing said diode capacitors individually at particular bias levels, a control circuit connected to said second network for introducing a direct current signal to the common junction of said inter-connected diode capacitors to increase the capacitance of one of said diode capacitors and to decrease the capacitance of the other of said diode capacitors so as to control the capacitance ratio thereof as an essentially linear function of the direct current signal, and a pair of temperature compensating diodes included in said bias circuit and respectively connected in circuit with respective ones of said voltage-variable diode capacitors and exhibiting corresponding variations in impedance for changes in ambient temperature to vary the individual biases on said voltage-variable diode capacitors for such changes in ambient temperature.

2. The bridge network of claim 1 wherein said first network includes a first inductance forming a transformer primary winding and adapted to receive an alternating current signal, second and third inductances forming a secondary winding for said transformer and further forming said first and second bridge arms respectively, movable core means acting to control the coupling of said alternating current signal from said primary to said secondary windings, the ratio of said electrical signal appearing in said first and second bridge arms being a linear function of the position of said movable core.

References Cited by the Examiner

UNITED STATES PATENTS

| | | | |
|---|---|---|---|
| 2,452,560 | 11/1948 | Gainer | 336—118 X |
| 3,056,039 | 9/1962 | Onyshkevych et al. | 307 88.5 |
| 3,101,452 | 8/1963 | Holcomb et al. | 307—88.5 |
| 3,177,427 | 4/1965 | Kuntz et al. | 323—75 |
| 3,196,368 | 7/1965 | Potter | 323—128 X |

JOHN F. COUCH, *Primary Examiner.*

LLOYD McCOLLUM, *Examiner.*

A. D. PELLINEN, *Assistant Examiner.*